United States Patent [19]
Usami

[11] Patent Number: 6,141,727
[45] Date of Patent: Oct. 31, 2000

[54] DEVICE AND METHOD FOR CONTROLLING DATA STORAGE DEVICE

[75] Inventor: Hajime Usami, Nagoya, Japan

[73] Assignee: Brother Kogyo Kabushiki Kaisha, Aichi-ken, Japan

[21] Appl. No.: 09/184,094

[22] Filed: Oct. 30, 1998

[30] Foreign Application Priority Data

Oct. 31, 1997 [JP] Japan .................................. 9-316100

[51] Int. Cl.⁷ .................................................. G06F 12/00
[52] U.S. Cl. ........................ 711/105; 711/100; 711/154; 365/230.06; 365/233
[58] Field of Search .................... 711/105, 100, 711/154; 365/230.06, 233

[56] References Cited

U.S. PATENT DOCUMENTS

| | | | |
|---|---|---|---|
| 4,899,316 | 2/1990 | Nagami | 365/189.01 |
| 5,644,549 | 7/1997 | Ju | 365/235 |
| 5,930,523 | 7/1999 | Kawasaki et al. | 712/32 |

*Primary Examiner*—Do Hyun Yoo
*Assistant Examiner*—Mehdi Namazi
*Attorney, Agent, or Firm*—Pitney, Hardin, Kipp & Szuch LLP

[57] ABSTRACT

A device and method for controlling a data storage device, wherein when executing a read cycle onto EDO-DRAM during EDO page mode, the row address strobe signal (RAS) is switched to High at the end of each read cycle. It therefore becomes possible to prevent data output conflicts between EDO-DRAM output data and ROM output data when a ROM read cycle is executed between DRAM read cycles. Accordingly, even when a SIMM configured with EDO-DRAM is used in a data storage device, it is possible to perform EDO mode reading operation for the SIMM, thereby enhancing operation speeds.

16 Claims, 11 Drawing Sheets

FIG. 3 (a)
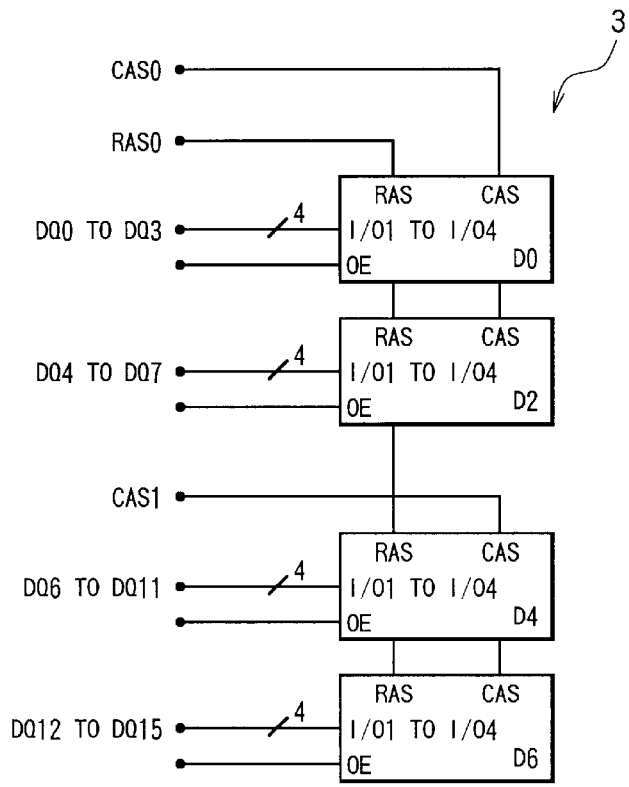
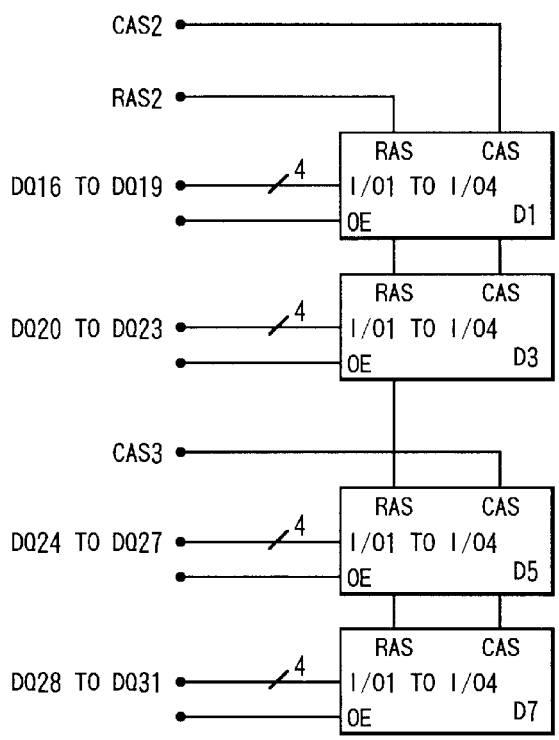

FIG. 3 (b)
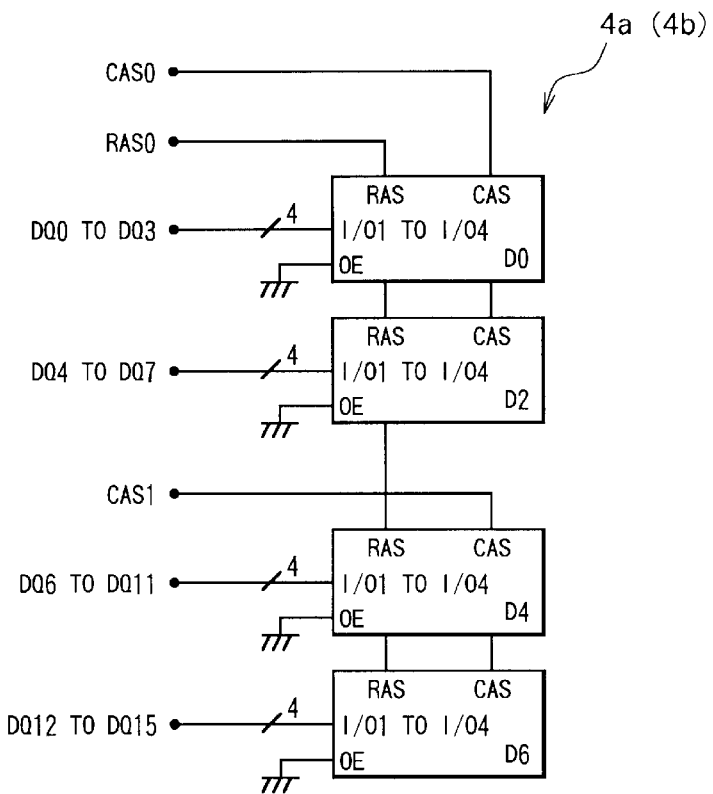
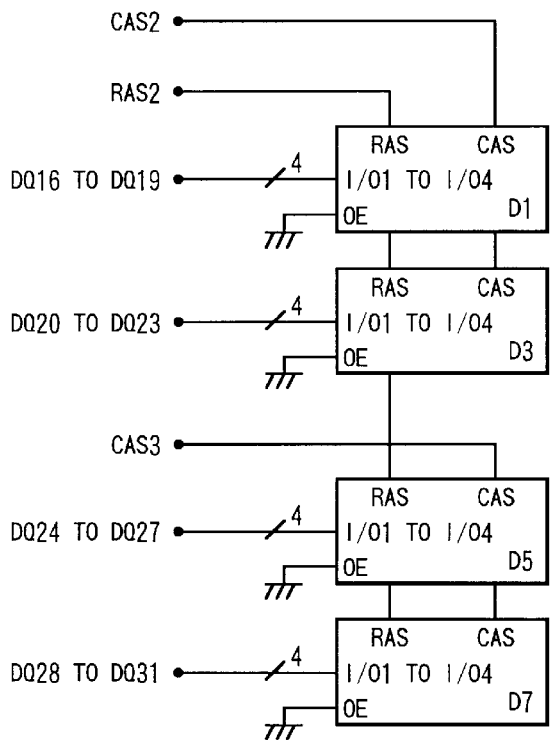

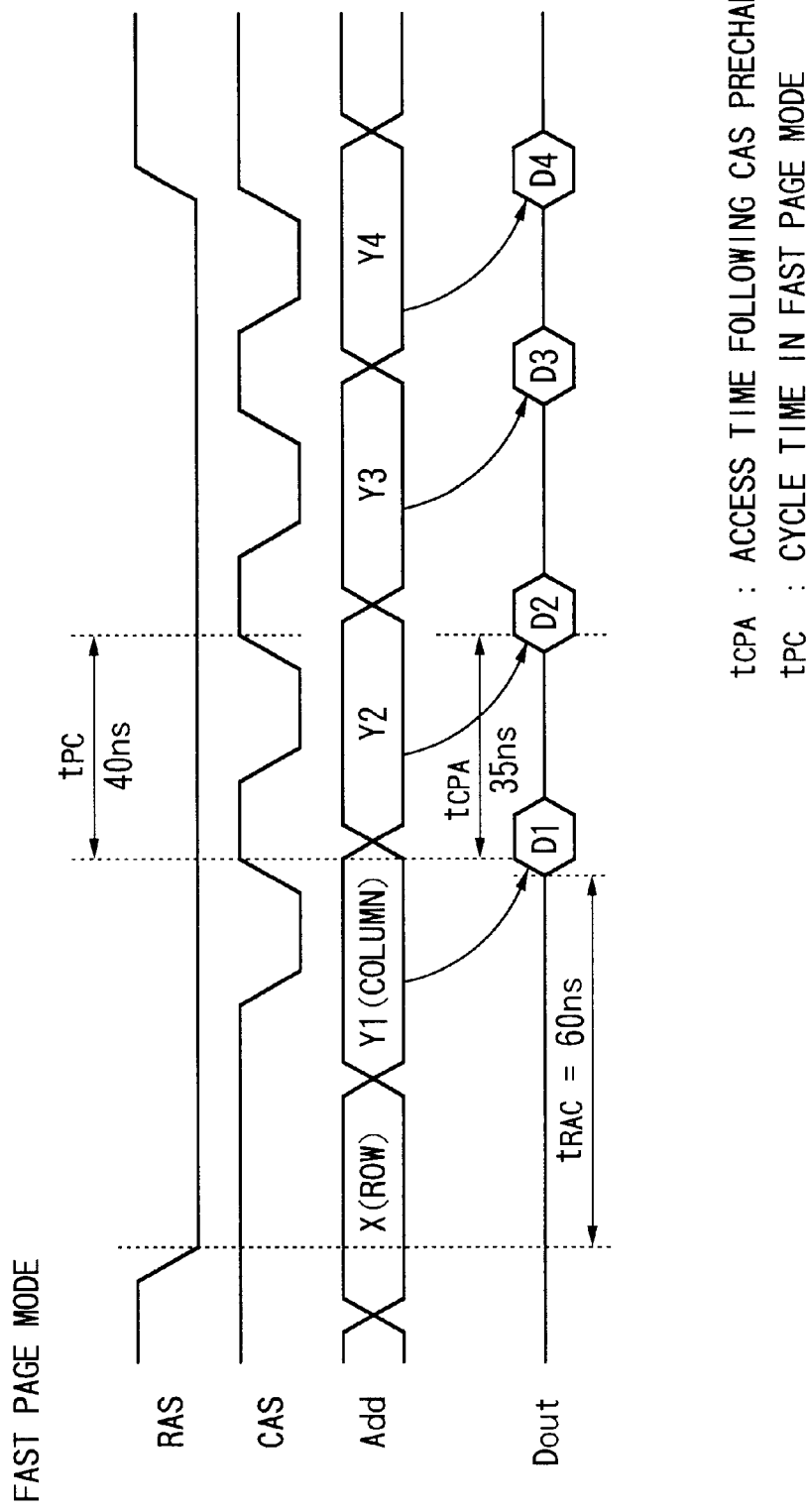

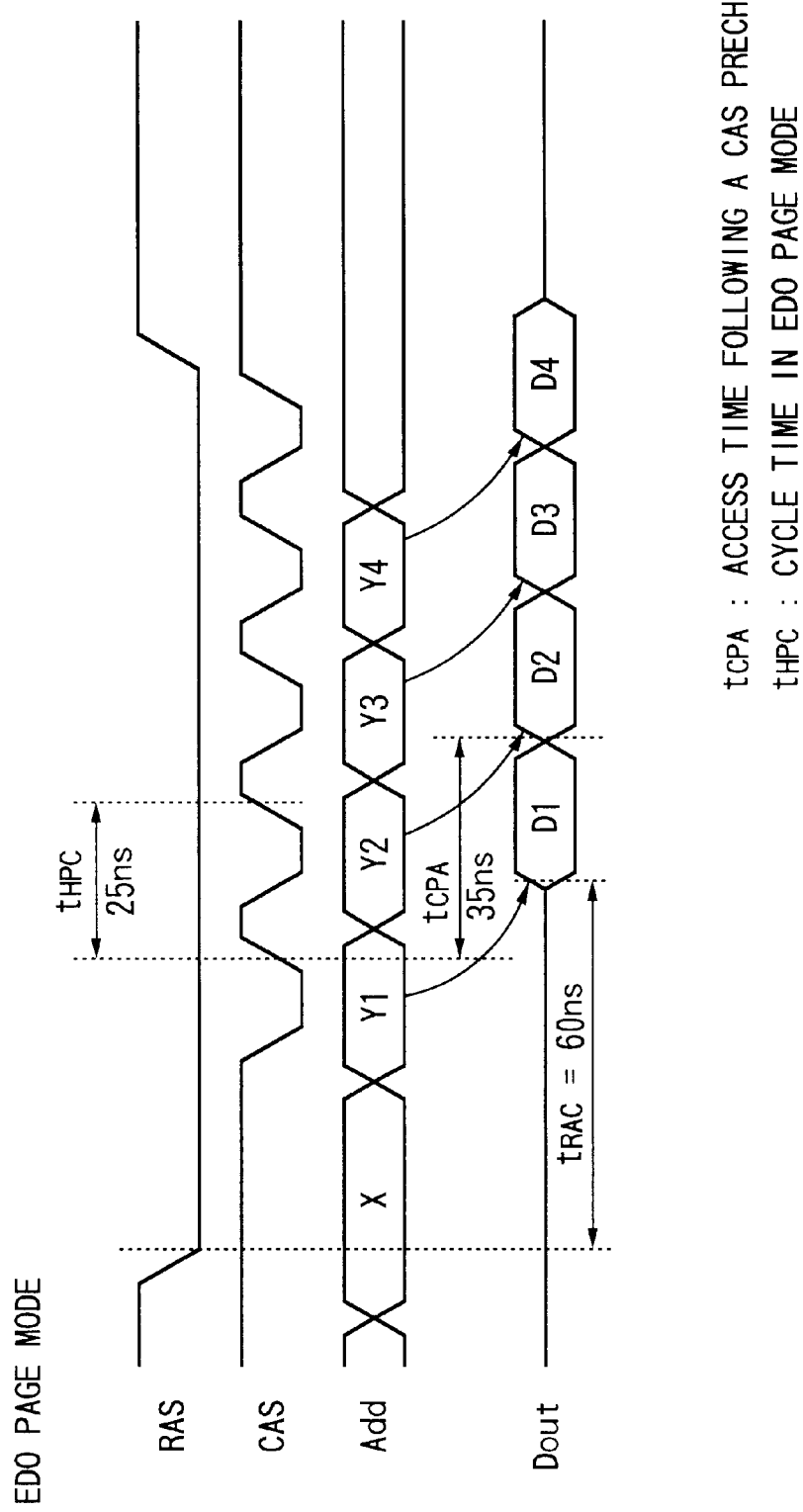

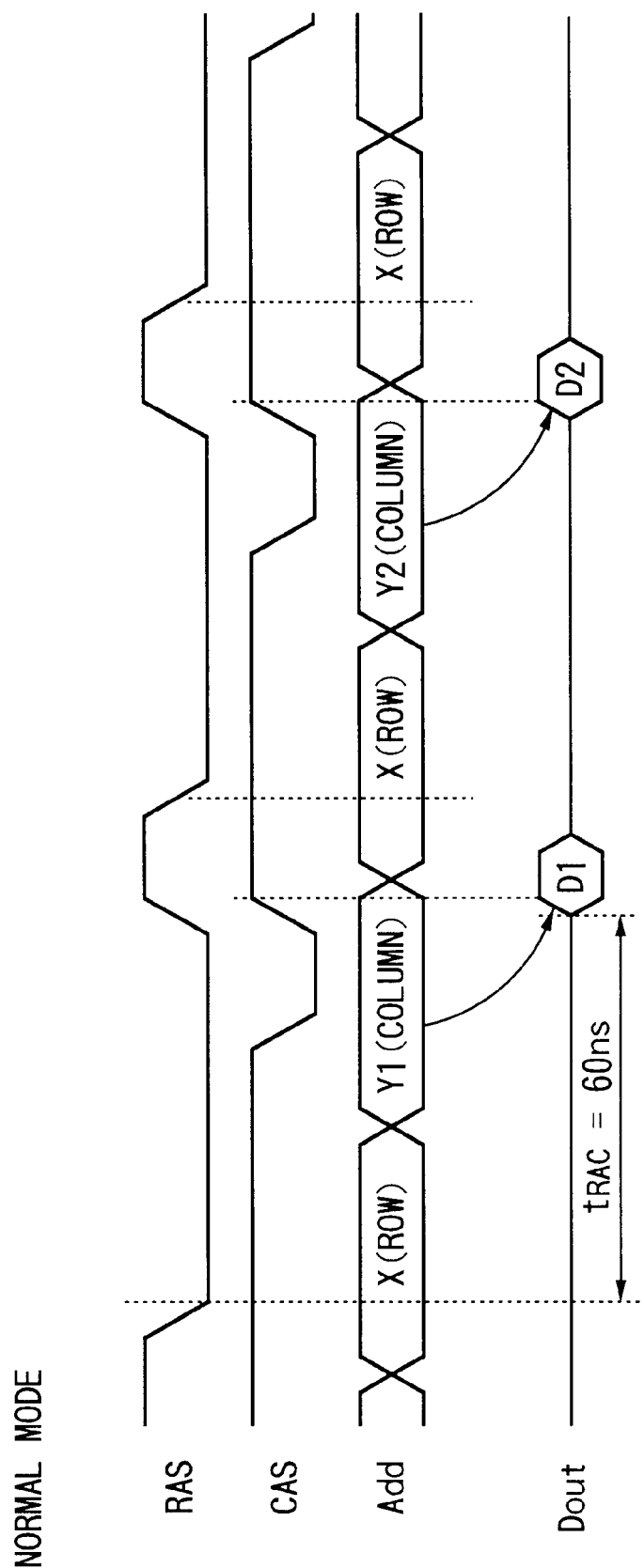

DEVICE AND METHOD FOR CONTROLLING DATA STORAGE DEVICE

BACKGROUND OF THE INVENTION

1. Field of the Invention

The present invention relates to a device and method for controlling a data storage device, such as DRAM (dynamic random access memory) and the like.

2. Description of Related Art

DRAM is generally used as a main memory for a microprocessor or the like computer. Efforts have been made to increase the capacity of this DRAM in order to improve the performance of the entire computer systems.

In recent years, there has been increasing demand not only to increase the memory capacity, but also to increase the speed of microprocessors by increasing the data transfer rate of the DRAM, and to create more diverse systems by diversifying the operating modes. This has led to the development of DRAM provided with a variety of operating modes.

For example, DRAM is recently designed to perform a high-speed access mode called "page mode". To understand this mode, it is important to understand that the greatest part of a DRAM cycle is occupied by the time from word line selection to sense amplifier operation and by the precharge time following these operations. Page mode is a reading mode that eliminates this time.

More specifically, when the row address is fixed, page mode allows the row address to remain fixed and specifies column addresses in order to serially and continuously access sequential portions of the sense amplifier by the number of bits specified in the column addresses.

By performing read operations using page mode, the cycle time, that is the time from the beginning of one access to the beginning of the next, can be reduced to about ⅓ that in normal mode, thereby enabling the performance of high-speed operations in DRAM.

Further, now DRAM designed to perform an EDO (Extended Data Out) page mode has been developed. This EDO page mode can achieve a data transfer rate even faster than the page mode described above. Conventional DRAM uses an output control method during a read cycle to place output data in a state of high impedance on the rising edge of a column address strobe (CAS) signal. Accordingly, when the CAS signal rises, in conventional DRAM, the effect is to disable the input and output data. In contrast, output data in the EDO page mode is still maintained even when the CAS signal is switched to High. Hence, the cycle time in EDO page mode can be further reduced over the fast page mode.

SUMMARY OF THE INVENTION

However, DRAMs provided with EDO page mode (hereinafter referred to as EDO-DRAM) not only are mounted in data processing systems as single EDO-DRAM devices, but also are mounted in data processing systems in the form of SIMMs (Single In-line Memory Modules), in each of which a plurality of EDO-DRAMs are mounted in one package.

In each EDO-DRAM mounted in SIMM, an output enable terminal for controlling data output is fixed at low level. That is, the output is constantly enabled. Fast reading operation can therefore be attained without controlling the output enable signal. With this structure, when reading operations are performed in EDO mode, the data output terminal does not become high impedance. If a read cycle is performed for ROM or another recording device between read cycles of the EDO-DRAM, the output data for the two cycles will conflict with each other. Hence, the operations will not be performed properly. In this respect, read operations in EDO mode cannot be performed when using SIMMs with EDO-DRAMs. Accordingly, high-speed operations cannot be achieved.

In view of the foregoing, it is an object of the present invention to provide a device and method for controlling a data storage device, in which high-speed reading operations in EDO mode can be attained even when using SIMMs containing EDO-DRAMs.

In order to attain the above and other objects, the present invention provides a control system comprising: a data storage device provided with a plurality of memory elements arranged in a matrix form, each memory element being defined by a corresponding column address and a corresponding row address, the data storage device being able to output process data from each memory element, accessed by corresponding row address data and a row address strobe signal in a selected state and corresponding column address data and a column address strobe signal in a selected state, the data storage device being able to output process data from the accessed memory element even after a column address strobe signal switches to a non-selected state; means for selecting either one of a write mode for writing process data to a desired memory element and a read mode for reading process data from a desired memory element; means for determining to execute a continuous mode for switching only column address data while fixing row address data when desiring to select at least one memory element located in a single row address; and means for, when the continuous mode is determined to be executed, serially accessing at least one desired memory element defined by a single row address and at least one column address through outputting one set of row address data indicative of the row address and continuously outputting a row address strobe signal of the selected state to continuously select the single row address while successively outputting at least one set of column address data indicative of the at least one column address and successively outputting a column address strobe signal of a selected state, the memory element accessing means switching, during the read mode, the row address strobe signal to a non-selected state at a timing when reading is completed from the desired at least one memory element.

According to another aspect, the present invention provides a control device for controlling a data storage device provided with a plurality of memory elements which are arranged in a matrix form, the data storage device being designed so that a desired memory element can be selected through input of a set of row address data and a set of column address data indicative of the desired memory element and a row address strobe signal and a column address strobe signal, and so that process data can be read from and written into the selected memory element, the data storage device being designed so that a plurality of memory elements on the same single row can be selected through input of the row address strobe signal and a set of row address data indicative of the subject row and successive inputs of a plurality of sets of column address data while the column address strobe signal is repeatedly switched, the desired plurality of memory elements being selected continuously even during selection time periods where the column address strobe signal is selected to be switched, the control device comprising: means for selecting either one of a write mode for writing process data to a desired memory element and a read mode for reading process data from the desired memory element; means for determining, as a memory element selection mode, a continuous mode for selecting a desired memory element through switching only the column address data while fixing the row address data; means for selecting at least one desired memory element on a single row through outputting, into the data storage device, a set of row address data indicative of the subject row and a row address strobe signal of a fixed state so as to be capable of continuously selecting the subject row address, while switchingly outputting at least one set of column address data so as to be capable of serially selecting at least one column address, the memory element selecting means, when the read mode is selected during the continuous mode, switching the row address strobe signal to a non-selected state at a timing when reading is completed from the selected memory element; and means for reading process data from the selected at least one memory element when the read mode is selected and for writing process data into the selected at least one memory element when the write mode is selected.

According to still another aspect, the present invention provides a method for controlling a data storage device provided with a plurality of memory elements which are arranged in a matrix form, the data storage device being designed so that a desired memory element can be selected through input of a set of row address data and a set of column address data indicative of the desired memory element and a row address strobe signal and a column address strobe signal, and so that process data can be read from and written into the selected memory element, the data storage device being designed so that a plurality of memory elements on the same single row can be selected through input of the row address strobe signal and a set of row address data indicative of the subject row and then successive inputs of a plurality of sets of column address data while the column address strobe signal is repeatedly switched, the desired plurality of memory elements being selected continuously even during selection time periods where the column address strobe signal is selected to be switched, the control method comprising the steps of: selecting either one of a write mode for writing process data to a desired memory element and a read mode for reading process data from the desired memory element; determining, as a memory element selection mode, a continuous mode for selecting a desired memory element through switching only the column address data while fixing the row address data; selecting at least one desired memory element on a single row through outputting, into the data storage device, a set of row address data indicative of the subject row and a row address strobe signal of a fixed state so as to be capable of continuously selecting the subject row address, while switchingly outputting at least one set of column address data so as to be capable of serially selecting at least one column address, the memory element selecting step, when the read mode is selected during the continuous mode, switching the row address strobe signal to a non-selected state at a timing when reading is completed from the selected memory element; and reading process data from the selected at least one memory element when the read mode is selected and writing process data into the selected at least one memory element when the write mode is selected.

BRIEF DESCRIPTION OF THE DRAWINGS

In the drawings:

FIG. 3(a) is a block diagram showing a construction of an internal RAM 3 provided with eight DRAMs;

FIG. 3(b) is a block diagram showing a construction of an external RAM 4 (4a or 4b), which is provided with eight DRAMs;

FIG. 5(a) is a timing chart of a fast page mode read cycle executed in a fast page mode DRAM (non-EDO-DRAM) used in the system of FIG. 1;

FIG. 5(b) is a timing chart of an EDO page mode read cycle executed in an EDO-DRAM used in the system of FIG. 1;

FIG. 9 is a timing chart of a normal mode read cycle executed in a normal mode DRAM.

DETAILED DESCRIPTION OF THE PREFERRED EMBODIMENT

Figure 1:
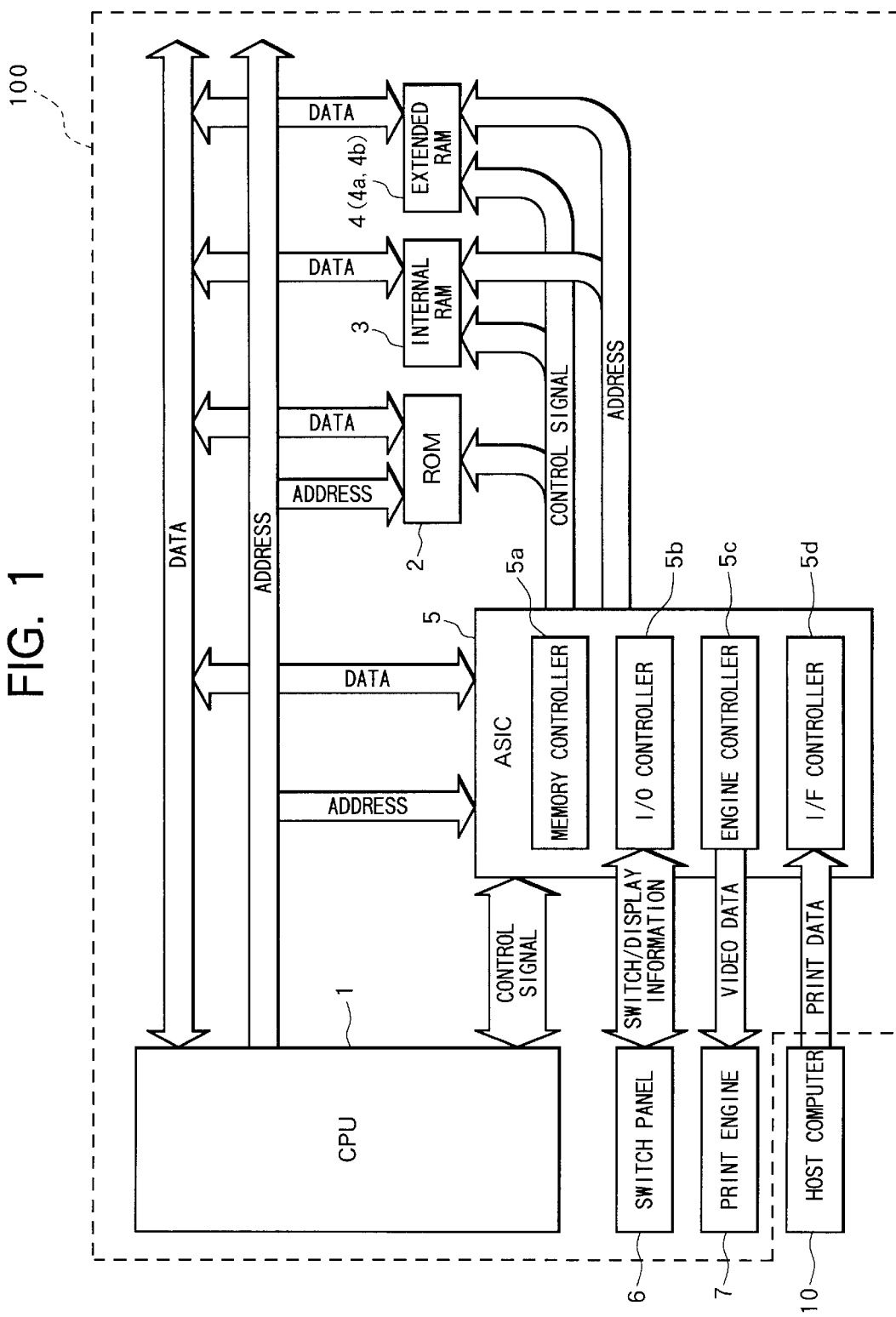
FIG. 1 is a block diagram showing a construction of a data processing system according to an embodiment of the present invention.

A device and method for controlling a data storage device according to a preferred embodiment of the present invention will be described while referring to the accompanying drawings, FIG. 1 shows the general construction of a print system (data processing system), in which the data storage device controlling device of the present embodiment is applied.

This print system is constructed from a printing device 100 and a host computer 10, which is a personal computer or the like. The printing device 100 and the host computer 10 are connected to each other. The printing device 100 is for receiving print data outputted from the host computer 10, and is for temporarily storing the print data in internal and extended RAM device 3 or 4 provided therein. The printing device 100 is also for producing video data based on the print data and for performing a print operation through outputting the video data to a printing engine 7 provided therein.

The construction of the printing device 100 will be described below in greater detail.

As shown in FIG. 1, the printing device 100 includes a CPU 1; a ROM 2; the internal RAM 3; the extended RAM device 4 including extended RAMs 4a and 4b; an Application Specific Integrated Circuit (ASIC) 5; a switch panel 6; and the print engine 7. The ASIC 5 is connected to the CPU 1, the ROM 2, the internal RAM 3, the external RAM portion 4, the switch panel 6, and the print engine 7 via various bus lines. The CPU 1 is also connected directly to the ROM 2, the internal RAM 3, and the external RAM portion 4 via other various bus lines.

The ROM 2 is a memory device for storing various control programs to be executed by the CPU 1. The control programs include a control program shown in FIGS. 7 and 8. In addition to the programs to be executed by the CPU 1, the ROM 2 also stores therein table data and the like. The ROM 2 further stores therein a memory map shown in FIG. 4 prepared for the printer 100. The memory map records addresses assigned to each memory mounted in the printer 100.

The CPU 1 is for controlling the various components, such as the ASIC 5, based on the control programs stored in the ROM 2. More specifically, the CPU 1 performs operations to output address data, to input and output data from and to components assigned by the address data, and to input and output control signals from and to each component.

The internal RAM 3 is a data storage device serving as both a main memory of the data processing system and as a work area used by the CPU 1 for performing calculations.

The extended RAM portion 4 has the extended RAMs 4a and 4b. Each of the extended RAMs 4a and 4b is a data storage device that can be installed to the printing device 100 when the need arises in order to increase the capacity of the main memory 3.

The ASIC 5 is an IC circuit specific to this data processing system, and is provided to reduce the processing load on the CPU 1. The ASIC 5 includes: a memory control circuit 5a for controlling the ROM 2, the internal RAM 3, and the extended RAMs 4a and 4b; an I/O control circuit 5b for controlling the switch panel 6; an engine control circuit 5c for controlling the print engine 7; and an interface control circuit 5d for controlling communications with the host computer 10.

The memory control circuit 5a includes: a DRAM control circuit 50a (shown in FIG. 2) for controlling the internal RAM 3 and the extended RAMs 4a and 4b; and a ROM control circuit 50b (not shown) for controlling the ROM 2.

In the data processing system of the present embodiment, each of the control circuits 5a–5d in the ASIC 5 is assigned a specific address. The CPU 1 can access any of these control circuits 5a–5d by accessing the address specified for that control circuit.

The switch panel 6 includes: a display device, switches, and the like which are provided in a panel on the printing device 100. The switch panel 6 enables a user to set operation modes of the printing device 100 through manipulating the switches, and displays error messages and the like on the display device.

The print engine 7 is an image forming device for forming images with using either an electrophotographic method or an ink-jet method. The print engine 7 forms images on a recording paper based on video data outputted from the engine control circuit 5c.

Next, the configuration of the data storage control portion in the above-described print system will be described below in greater detail with reference to FIG. 2.

Figure 2:
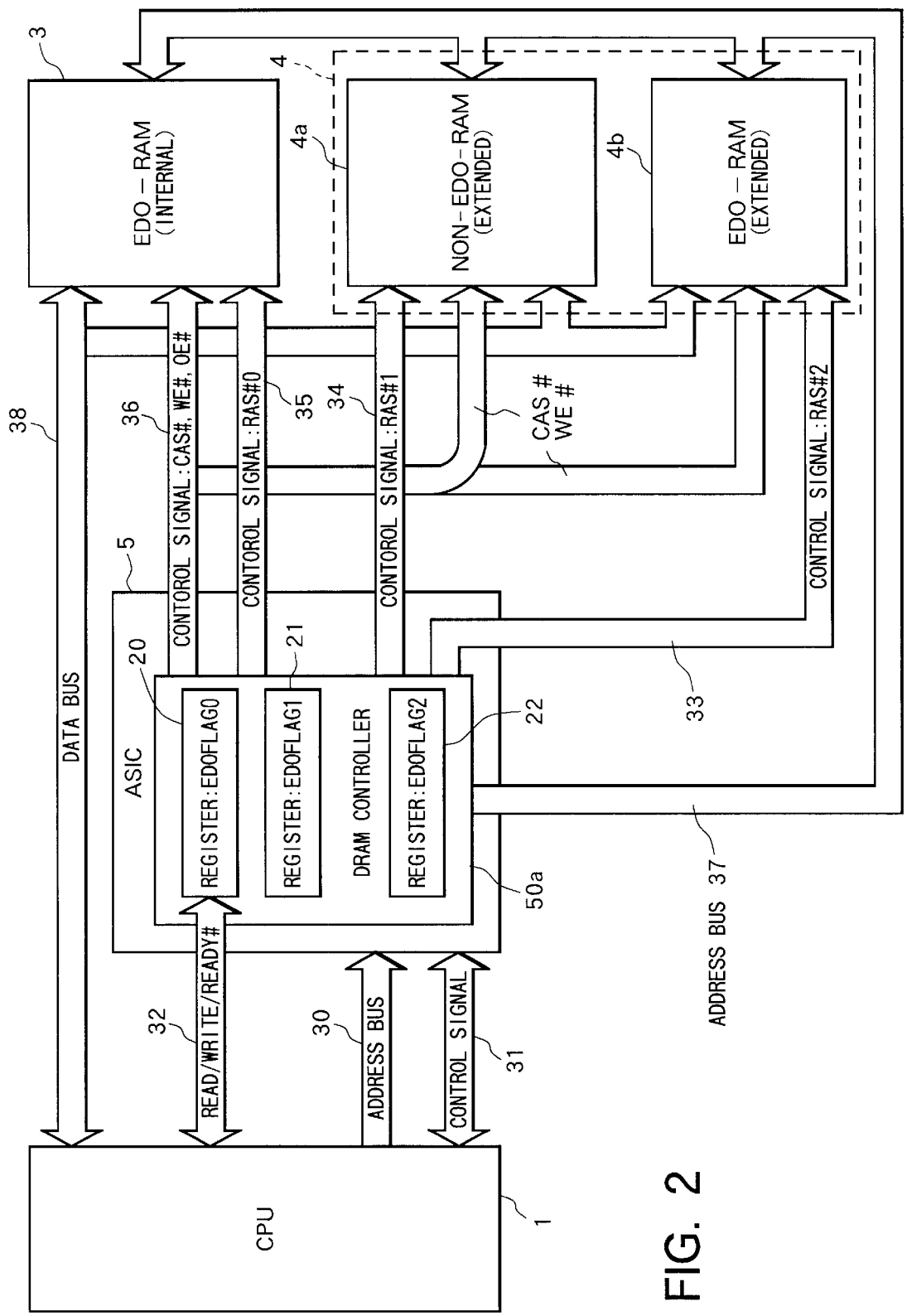
FIG. 2 is an essential part of the block diagram of FIG. 1, and shows data storage devices and a control device for the storage devices in the data processing system.

FIG. 2 shows a configuration of a DRAM control portion in the print system of FIG. 1. In the DRAM control portion, the DRAM control circuit 50a controls the RAMs 3, 4a, and 4b under control of the CPU 1.

In this example, one (1) word is formed of four (4) bits. As shown in FIG. 3(a), the internal RAM 3 includes eight (8) EDO-DRAMs (Extended Data Out Dynamic Random Access Memories), each having a capacity of 4M words.

Each of the extended RAMs 4a and 4b is constructed from a SIMM (Single In-line Memory Module). In each SIMM, eight DRAMs are combined in one package as shown in FIG. 3(b). Each DRAM has a capacity of 4M words. In this example, the extended RAM 4a is configured from eight non-EDO-DRAMs (fast mode DRAMs), while the extended RAM 4b is configured from eight EDO-DRAMs.

Each DRAM (EDO-DRAM and non-EDO-DRAM) in each of the internal and external RAMs 3, 4a, and 4b has: a row address strobe signal terminal RAS; a column address strobe signal terminal CAS; an input/output terminal I/O; a write enable terminal WE (not shown); and an output enable terminal OE.

The row address strobe signal terminal RAS is for receiving a row address strobe signal RAS#0 from the DRAM control circuit 50a. The column address strobe signal terminal CAS is for receiving a column address strobe signal CAS# from the DRAM control circuit 50a. The write enable signal terminal WE is for receiving a write enable signal WE# from the DRAM control circuit 50a. The input/output terminal I/O is for receiving and outputting data from and to the CPU 1. Although not shown in the drawings, the input/output terminal I/O is connected to a pull-up resistor. With this structure, output data from the input/output terminal I/O will become high level when a predetermined time has elapsed after the output data became a high impedance state.

It is noted that in each DRAM for the internal DRAM 3, the output enable terminal OE is designed to receive an output enable signal OE# from the DRAM control circuit 50a. Contrarily, in each DRAM for the extended DRAMs 4a and 4b, the output enable terminal OE is electrically grounded or is fixed to low level.

Although not shown in the drawings, each DRAM (EDO-DRAM and non-EDO-DRAM) has a memory structure, in which a plurality of memory cells are arranged in a matrix form, that is, in a plurality of rows and in a plurality of columns.

Figure 4:
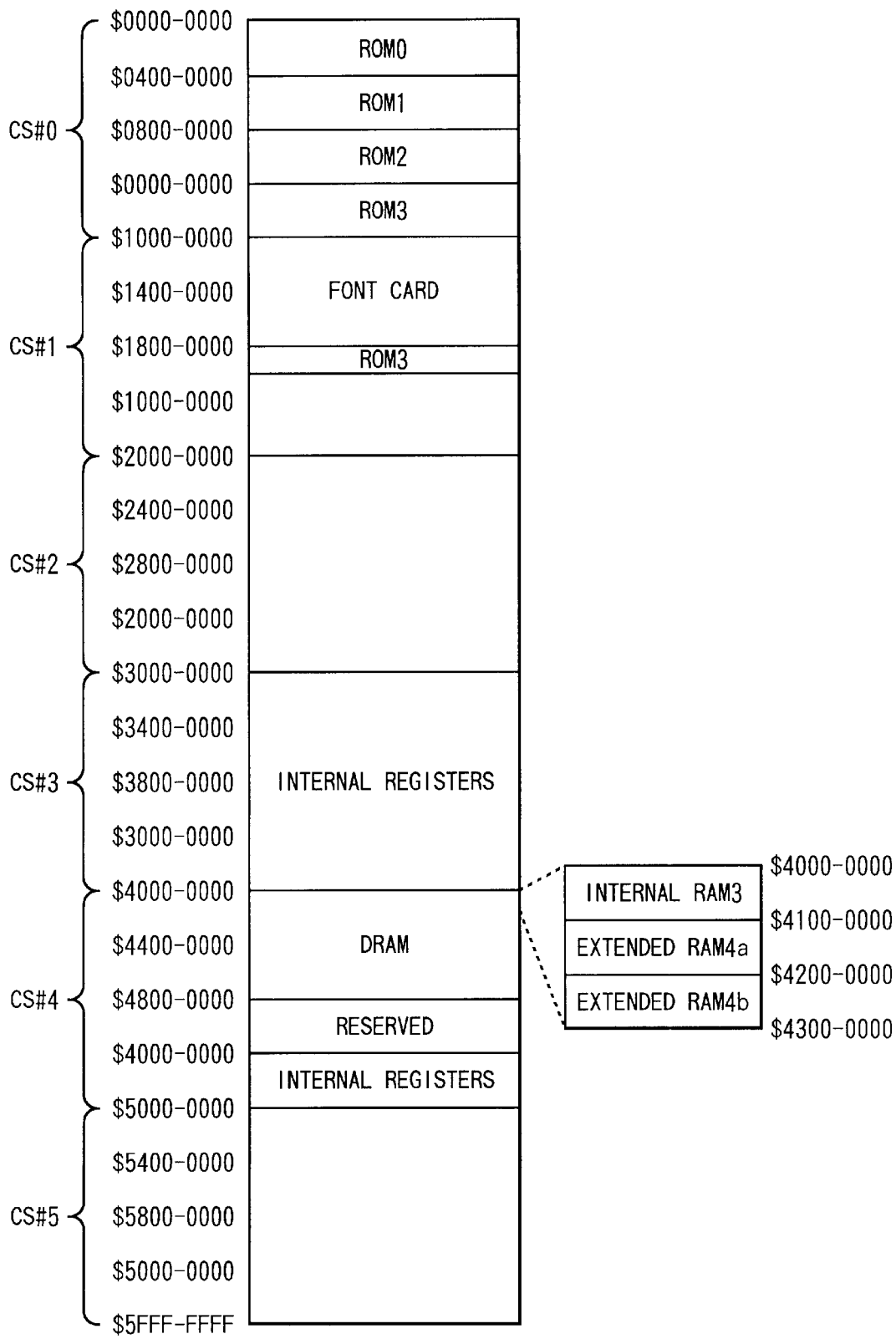
FIG. 4 is an explanatory diagram showing a memory map for the system in FIG. 1.

The internal RAM 3 and the extended RAM 4a and 4b are allocated in the memory map shown in FIG. 4. In this example, addresses "40000000"–"40FFFFFF" are allocated for the internal RAM 3, addresses "41000000"–"41FFFFFF" are allocated for the extended RAM 4a, and addresses "42000000"–"42FFFFFF" are allocated for the extended RAM 4b.

As shown in FIG. 2, the DRAM control circuit 50a includes: a first EDO flag register (EDOFLAG0) 20, a second EDO flag register (EDOFLAG1) 21, and a third EDO flag register (EDOFLAG2) 22. The first through third EDO flag registers 20–22 are provided in correspondence with the RAMs 3, 4a, and 4b, respectively. That is, the first EDO flag register 20 is for identifying whether or not the internal RAM 3 is constructed from EDO-DRAMs. The second EDO flag register 21 is for identifying whether or not the extended RAM 4a is constructed from EDO-DRAMs. The third EDO flag register 22 is for identifying whether or not the extended RAM 4b is constructed from EDO-DRAMs.

Each of the registers 20–22 is set to either a value of zero (0) or one (1) during an EDO-DRAM determining process of FIGS. 7 and 8 described later. That is, each register (20, 21, or 22) is set with the value of one (1) when the corresponding RAM is determined to be constructed from EDO-DRAMs. Each register (20, 21, or 22) is set with the value of zero (0) when the corresponding RAM is determined not to be constructed from EDO-DRAMs. In this example, the registers 20 and 22 will be set to one (1), and the register 21 will be set to zero (0) during the EDO-DRAM determining process.

The DRAM control circuit 50a is connected to the CPU 1 via; an address bus line 30, a control bus line 31, and a read/write control bus line 32. The DRAM control circuit 50a is also connected to the RAMs 3, 4a, and 4b via: control bus lines 33, 34, 35, and 36, and an address bus line 37. The CPU 1 is connected to the RAMs 3, 4a, and 4b via a data bus line 38.

With this arrangement, the DRAM control circuit 50a controls various control signals to the DRAMs 3, 4a, and 4b based on control signals supplied from the CPU 1 via the control signal bus 31. More specifically, the DRAM control circuit 50a receives various control signals from the CPU 1 via the control bus line 31. The control signals are for controlling the DRAM control circuit 50a to perform data input/output operation onto a desired memory 3, 4a, or 4b. The DRAM control circuit 50a further receives address data from the CPU 1 via the address bus line 30. The address data specifies a memory cell desired to be accessed in either the RAM 3, 4a, or 4b. The DRAM control circuit 50a also receives read/write control signals from the CPU 1 via the read/write control bus line 32. The read/write control signals are for controlling the DRAM control circuit 50a into a data read mode for reading data from the desired memory or into a data write mode for writing data into the desired memory. The DRAM control circuit 50a also receives a ready signal READY# from the CPU 1 via the read/write control bus line 32. The ready signal READY# is for indicating an end timing of each read cycle executed for each DRAM.

In response to the above-described various signals from the CPU 1, the DRAM control circuit 50a outputs various control signals to the DRAMs 3, 4a, and 4b. Those control signals include: row address strobe signals RAS#0, RAS#1, and RAS#2; column address strobe signals CAS#; write enable signals WE#; and output enable signals OE#. More specifically, the DRAM control circuit 50a outputs column address strobe signals CAS# and write enable signals WE# via the control bus line 36 to each of the RAMs 3, 4a, and 4b. The DRAM control circuit 50a further outputs output enable signals OE# via the control bus line 36 to the internal RAM 3 only. The DRAM control circuit 50a outputs a row address strobe signal RAS#0 to the RAM 3 via the control bus line 35. The DRAM control circuit 50a outputs another row address strobe signal RAS#1 to the RAM 4a via the control bus line 34. The DRAM control circuit 50a outputs still another row address strobe signal RAS#2 to the RAM 4b via the control bus line 33. The DRAM control circuit 50a outputs row address data and column address data to each of the memories 3, 4a, and 4b via the address bus line 37. The row address data and column address data are indicative of a memory cell desired to be accessed. The CPU 1 reads data from the accessed memory cell in the memory 3, 4a, or 4b via the data bus line 38 during the read cycle. The CPU 1 writes data into the accessed memory cell in the memory 3, 4a, or 4b via the data bus line 38 during the write cycle.

The DRAM control circuit 50a is for determining a memory cell desired to be accessed, based on address data supplied from the CPU 1. When the determined memory cell is located in the address area for the internal RAM 3, the DRAM control circuit 50a refers to the first flag register (EDOFLAG0) 20. Based on the value set in the flag register 20, the DRAM control circuit 50a determines which operation mode should be executed to access the memory cell. Because the value of one (1) is set in this example, the DRAM control circuit 50a determines to execute the EDO-mode shown in FIG. 5(b) to access the memory cell.

When the determined memory cell is located in the address area for the external RAM 4a, the DRAM control circuit 50a refers to the second flag register (EDOFLAG1) 21. Based on the value set in the flag register 21, the DRAM control circuit 50a determines which operation mode should be executed to access the memory cell. Because the value of zero (0) is set in this example, the DRAM control circuit 50a determines to execute the non-EDO-mode (fast page mode, in this example) shown in FIG. 5(a) to access the memory cell.

When the determined memory cell is located in the address area for the RAM 4b, the DRAM control circuit 50a refers to the third flag register (EDOFLAG2) 22. Based on the value set in the flag register 22, the DRAM control circuit 50a determines which operation mode should be executed to access the memory cell. Because the value of one (1) is set in this example, the DRAM control circuit 50a determines to execute the EDO-mode shown in FIG. 5(b) to access the memory cell. Because the desired memory cell address is located in the external memory area for the RAM 4b in the memory map of FIG. 4, the DRAM control circuit 50a knows that the memory cell be located in the external EDO-DRAM.

It is noted that when the CPU 1 desires to read data from one or more cells in some DRAM 3, 4a, or 4b, the CPU 1 supplies the DRAM control circuit 50a with a reading control signal via the control bus 32 during a read cycle to successively read data from the desired one or more memory cells. The CPU 1 supplies the control circuit 50a with a ready signal READY# at the end timing of the read cycle. When desiring to write data into one or more memory cells, on the other hand, the CPU 1 supplies the control circuit 50a with a writing control signal also via the control bus 32 during a write cycle to successively write data into those memory cells. While supplying the read control signal or the write control signal, the CPU 1 successively outputs, via the address bus 30, one or more sets of address data indicative of the desired one or more memory cells.

During each DRAM read/write cycle, the CPU 1 successively outputs, via the address bus 30, one or more sets of address data indicative of one or more memory cells desired to be accessed in the subject cycle. The DRAM control circuit 50a successively decodes the one or more sets of address data, and separates each address data set into row address data and column address data. Using the row address data and the column address data, the DRAM control circuit 50a successively accesses the desired memory cells during each DRAM read/write cycle.

The DRAM control circuit 50a performs data read operation onto the non-EDO-DRAM 4a in the fast page mode during each DRAM read cycle as shown in FIG. 5(a).

As shown in FIG. 5(a), when receiving address data indicative of a memory cell to be accessed first, the DRAM control circuit 50a decodes the received address data, and separates the address data into row address data and column address data. The DRAM control circuit 50a first outputs the row address data, and then switches the row address strobe signal RAS# from high level to low level. Next, the DRAM control circuit 50a outputs column address data, and then switches the column address strobe signal CAS# from high level to low level. As a result, the content of the memory cell is outputted as valid data and is read by the CPU 1.

When receiving address data for another memory cell to be accessed next, the DRAM control circuit 50a again decodes the address data, and separates the address data into row address data and column address data. If this memory cell has the same row address data as the previous memory cell, then the DRAM control circuit 50a maintains the row address strobe signal RAS# at Low as shown in FIG. 5(a).

The DRAM control circuit 50*a* then outputs the column address data for the present memory cell at the timing of the lowering edge of the column address strobe signal CAS#. The present memory cell is thus selected, and data from the selected memory cell is read at the rising edge of the column address strobe signal CAS#.

In order to perform write operation, the DRAM control circuit 50*a* executes each DRAM write cycle in the same manner and at the same timings as described above. In the write cycle, however, data outputted from the CPU 1 is written to the selected memory cell via the data bus 38.

The above-described reading/writing operation during the fast page mode enables fast reading/writing operation because reading operation and writing operation onto the same row address can be performed simply by switching the column address strobe signal CAS#. In the present embodiment, when the row address strobe access time $t_{RAC}$ is 60 ns and the column address strobe precharge access time $t_{CPA}$ is 35 ns. the data read cycle time $t_{PC}$ is 40 ns as shown in FIG. 5(*a*).

The DRAM control circuit 50*a* performs data read operation onto each of the EDO-DRAMs 3 and 4*b* in the EDO page mode during each DRAM read cycle as shown in FIG. 5(*b*).

In the same manner as described above: when receiving address data of a memory cell to be read first, the DRAM control circuit 50*a* decodes the address data, and separates the address data into row address data and column address data. The DRAM control circuit 50*a* supplies the row address data, and then switches the row address strobe signal RAS# from high level to low level. Next, the DRAM control circuit 50*a* outputs the column address data, and then switches the column address strobe signal CAS# from high level to low level. As a result, the content of the selected memory cell is outputted as valid data and is read by the CPU 1.

When receiving address data for another memory cell desired to be read next, the DRAM control circuit 50*a* again decodes the address data, and separates the address data into row address data and column address data. If this memory cell has the same row address data as the previous memory cell, then the DRAM control circuit 50*a* maintains the row address strobe signal RAS# at Low as shown in FIG. 5(*b*). The DRAM control circuit 50*a* outputs the column address data at the timing of the lowering edge of the column address strobe signal CAS#. The memory cell is thus selected, and the content of the memory cell is outputted as valid output data.

It is noted that in the EDO page mode, the output data remains valid even when the column address strobe signal CAS# becomes High. Hence, the CPU 1 can read data from the selected memory cell at the same timing when the next column address is inputted. Accordingly, during the EDO-mode, after outputting a row address, the DRAM control circuit 50*a* outputs the column address strobe signal CAS# in a series of pulses so that the CPU 1 can continuously read data in rapid succession. In this way, the read cycle time in EDO page mode can be reduced to less than the read cycle time used in the fast page mode. As described already, in the present embodiment, the row address strobe access time $t_{RAC}$ is 60 ns and the column address strobe precharge access time $t_{CPA}$ is 35 ns. In the EDO page mode, the data read cycle time $t_{HPC}$ is reduced to reach 25 ns as shown in FIG. 5(*b*).

In order to perform writing operation, the DRAM control circuit 50*a* executes each DRAM write cycle in the same manner and at the same timings as described above. In the write mode, however, data outputted from the CPU 1 is written to the selected memory cell via the data bus 38.

Figure 6:
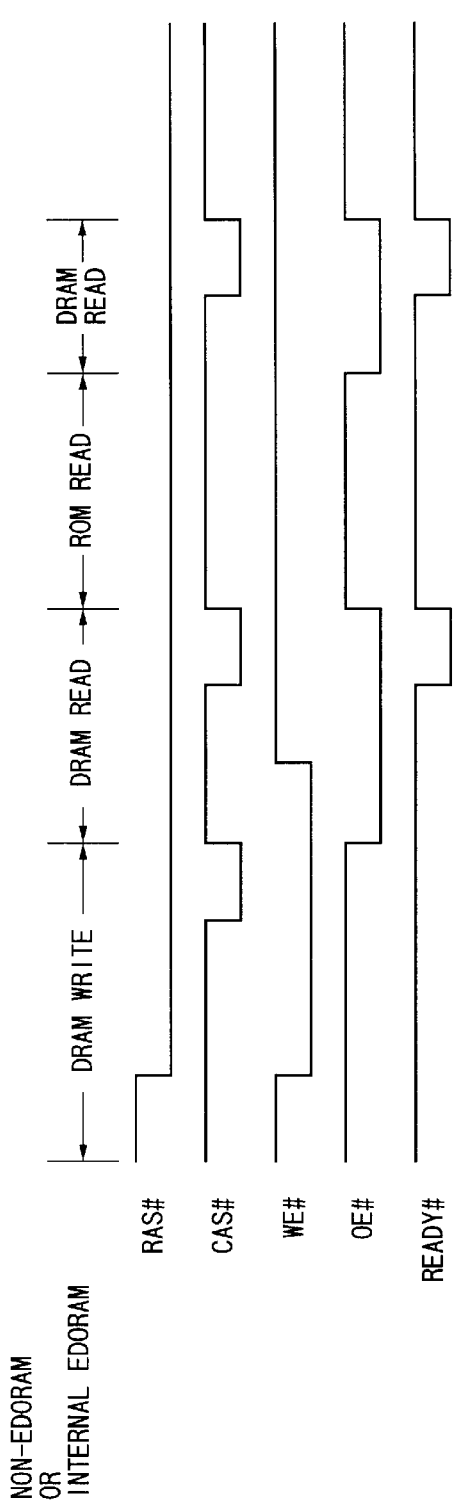
FIG. 6(a) is a timing chart showing a method for controlling a row address strobe (RAS) signal for DRAMs other than external DRAM.
FIG. 6(b) is a timing chart showing a method for controlling a row address strobe (RAS) signal for external DRAM.
Figure 6:
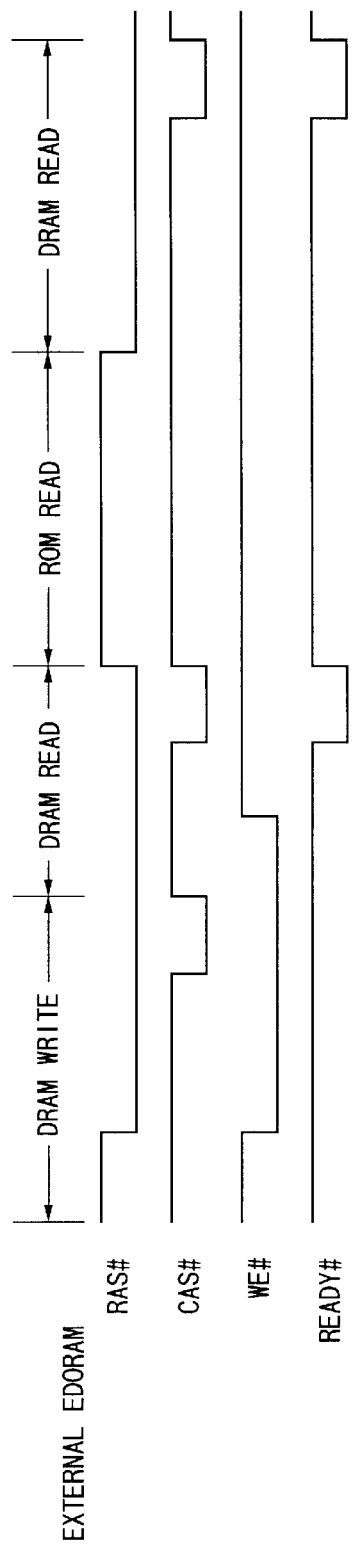

According to the present embodiment, the DRAM control circuit 50*a* performs the successive DRAM read/write cycles as shown in FIG. 6(*a*) onto each of the DRAMs 3 and 4*a*, which are not the external EDO-DRAMs. On the other hand, the DRAM control circuit 50*a* performs the successive DRAM read/write cycles as shown in FIG. 6(*b*) onto the external EDO-DRAM 4*b*.

More specifically, the DRAM control circuit 50*a* performs the successive DRAM read/write cycles onto the DRAM 3 as shown in FIG. 6(*a*). It is noted that each DRAM read/write cycle is simplified in FIG. 6(*a*), but is equivalent to the read/write cycle in EDO page mode in FIG. 5(*a*) in this case.

Although not shown in FIG. 6(*a*), the DRAM control circuit 50*a* receives a writing control signal (not shown) from the CPU 1 during each DRAM write cycle. While receiving the writing control signal, the DRAM control circuit 50*a* maintains the write enable signal WE# to low level so that the input/output terminals I/O are enabled to input data. While the enable signal WE# is thus maintained to low level, the DRAM control circuit 50*a* controls the row access strobe RAS# and the column address strobe CAS# as shown in FIG. 5(*b*) to successively access the one or more desired memory cells. Thus, during each DRAM write cycle, the DRAM control circuit 50*a* successively enables the desired one or more cells to be written with data.

Although not shown in the drawing, the DRAM control circuit 50*a* receives a reading control signal (not shown) from the CPU 1 during each DRAM read cycle. While receiving the reading control signal, the control circuit 50*a* maintains the output enable signal OE# to low level so that the input/output terminals I/O of the DRAM are enabled to output data. While the enable signal OE# is thus maintained to low level, the DRAM control circuit 50*a* controls the row access strobe RAS# and the column address strobe CAS# as shown in FIG. 5(*b*) to successively access the one or more desired memory cells. Thus, during each DRAM read cycle, the DRAM control circuit 50*a* successively enables the desired one or more cells to output data. Upon receipt of the ready signal READY# from the CPU 1, the control circuit 50*a* changes the output enable signal OE# to high level, thereby disabling the data output.

The DRAM control circuit 50*a* also performs the successive DRAM read/write cycles onto the DRAM 4*a* as shown in FIG. 6(*a*). It is noted that each DRAM read/write cycle is simplified in FIG. 6(*a*), but is equivalent to the read/write cycle in fast page mode in FIG. 5(*a*) in this case.

That is, while receiving the writing control signal (not shown) from the CPU 1, the DRAM control circuit 50*a* maintains the write enable signal WE# to low level so that the input/output terminals I/O are enabled to input data. While the enable signal WE# is thus maintained to low level, the DRAM control circuit 50*a* controls the row access strobe RAS# and the column address strobe CAS# as shown in FIG. 5(*a*) to successively access the one or more desired memory cells. Thus, during each DRAM write cycle, the DRAM control circuit 50*a* successively enables the desired one or more cells to be written with data.

It is noted that the output enable terminal OE of the extended non-EDO-DRAM 4*a* is fixed to low level. Accordingly, when performing each DRAM read cycle onto the extended non-EDO-DRAM 4*a*, the DRAM control circuit 50*a* executes the reading operation without outputting the output enable signal OE#. That is, while receiving the reading control signal from the CPU 1, the DRAM control circuit 50a controls the row access strobe RAS# and the column address strobe CAS# as shown in FIG. 5(*a*) to successively access the one or more desired memory cells. Thus, during each DRAM read cycle, the DRAM control circuit 50a successively enables the desired one or more cells to output data therefrom. Upon receipt of the ready signal READY# from the CPU 1, the control circuit 50a completes controlling the column address strobe signals as shown in FIG. 5(*a*). Because the DRAM control circuit 50a switches the column address strobe CAS# to high level as shown in FIG. 5(*a*), the data output is disabled from the fast page mode DRAM 4a.

The DRAM control circuit 50a performs the successive DRAM read/write cycles onto the DRAM 4b as shown in FIG. 6(*b*). It is noted that the DRAM read/write cycle is simplified in FIG. 6(*b*), but is equivalent to the read/write cycle in EDO page mode in FIG. 5(*b*) in this case.

That is, while receiving the writing control signal (not shown) from the CPU 1, the DRAM control circuit 50a maintains the write enable signal WE# to low level so that the input/output terminals I/O are enabled to input data. While the enable signal WE# is thus maintained to low level, the DRAM control circuit 50a controls the row access strobe RAS# and the column address strobe CAS# as shown in FIG. 5(*b*) to successively access the one or more desired memory cells. Thus, during each DRAM write cycle, the DRAM control circuit 50a successively enables the desired one or more cells to be written with data.

It is noted that the output enable terminal OE of the extended EDO-DRAM 4a is also fixed to low level. Accordingly, when performing each DRAM read cycle onto the extended non-EDO-DRAM 4a, the DRAM control circuit 50a executes the reading operation without outputting the output enable signal OE#. That is, while receiving the reading control signal from the CPU 1, the DRAM control circuit 50a controls the row access strobe RAS# and the column address strobe CAS# as shown in FIG. 5(*b*) to successively access the one or more desired memory cells. Thus, during each DRAM read cycle, the DRAM control circuit 50a successively enables the desired one or more cells to output data. Upon receipt of the ready signal READY# from the CPU 1, the control circuit 50a completes controlling the column address strobe signals as shown in FIG. 5(*b*), and switches the column address strobe CAS# to high level. Because the EDO-DRAM can maintain data output as valid even after the column address strobe CAS# changes to high level, the DRAM control circuit 50a further switches the row address strobe RAS# to high level, thereby disabling the input/output terminal I/O from outputting data.

As described above, when the internal EDO-DRAM 3 is operated in the EDO page mode, the output enable terminals OEs of the internal EDO-RAM 3 can be controlled by the output enable signal OE#. It is therefore possible to disable data output when necessary. Accordingly, even if a ROM read cycle is executed by the ROM control circuit 50b between successive DRAM read cycles as shown in FIG. 6(*a*), it is possible to avoid conflicts in data output. That is, when receiving the ready signal READY# at the end of each DRAM read cycle, the DRAM control circuit 50a switches the output enable signal OE# to High, thereby disabling data output from the EDO-DRAM 3. Subsequently, the ROM read cycle is executed.

Contrarily, as shown in FIG. 3(*b*), the extended EDO-DRAM 4b is the SIMM that is configured with eight EDO-DRAMs with their output enable terminals OEs being fixed to Low. Hence, output data from the extended EDO-RAM 4b becomes always valid during the EDO page mode. Therefore, when executing a ROM read cycle between successive DRAM read cycles onto the SIMM 4b, data output from the two can possibly conflict. Hence, in the present embodiment, the DRAM control circuit 50a raises the row address strobe signal RAS# to high level at the end of each DRAM read cycle, thereby disabling data output from the external EDO-DRAM. Conflicts between data outputted from the EDO-DRAM and data outputted from ROM 2 can be prevented, while executing the external EDO-DRAM 4b in EDO page mode.

With the above-described structure, the printing device 100 of the present embodiment operates as described below.

In order to perform the above-described special controls onto DRAMs according to their types, it is necessary to determine whether or not each of the DRAMs mounted in the device 100 is external EDO-DRAM and then to store data of the determined results to the corresponding flag register.

Figure 7:
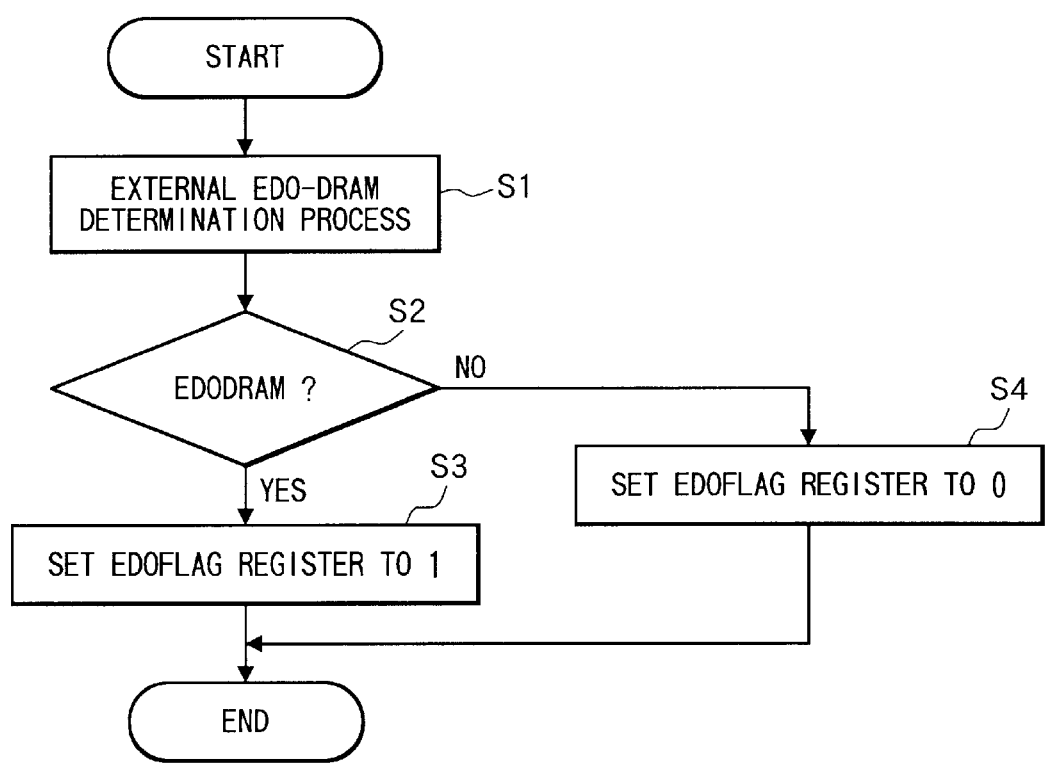
FIG. 7 is a flowchart showing an EDO-DRAM determining and storing process for the system in FIG. 1.

In the present embodiment, when the system 100 is first turned on, the CPU 1 performs a process of FIG. 7 to determine whether or not each of the DRAMs mounted to the system 100 is external EDO-DRAM and then to store data of the results of the determination.

More specifically, when the printer 100 is turned ON, the CPU 1 repeatedly executes the process of FIG. 7 for all the DRAMs 3, 4a, and 4b mounted to the printer 100. During the process of FIG. 7 for each DRAM 3, 4a, or 4b, the CPU 1 first performs a determination process of S1 to determine the type of the subject DRAM 3, 4a, or 4b. When the determination process of S1 is completed, the program proceeds to S2. In S2, the CPU 1 inspects the determination result from S1. That is, the CPU 1 judges whether or not the DRAM subjected to the determination process of S1 is EDO-DRAM. If the determination result indicates that the subject DRAM is EDO-DRAM (yes in S2), then the CPU 1 issues in S3 a control signal to set the corresponding EDO flag register EDOFLAG 20, 21, or 22 to one (1). If the subject DRAM is determined not to be EDO-DRAM (no in S2), on the other hand, then the CPU 1 issues in S4 a control signal to set the corresponding EDO flag register EDOFLAG to zero (0).

More specifically, the CPU 1 repeatedly performs the processes of FIG. 7 for all the DRAMs 3, 4a, and 4b. When the DRAM 3 is examined in S1, the examined result is set to the corresponding first EDO flag register (EDOFLAG0) 20 in S3 or S4. When the DRAM 4a is examined in S1, the examined result is set to the corresponding second EDO flag register (EDOFLAG0) 21 in S3 or S4. When the DRAM 4b is examined in S1, the examined result is set to the corresponding third EDO flag register (EDOFLAG0) 22 in S3 or S4. Thus, each DRAM is subjected to the process of FIG. 7 for determining the DRAM type and for storing the determined result.

Figure 8:
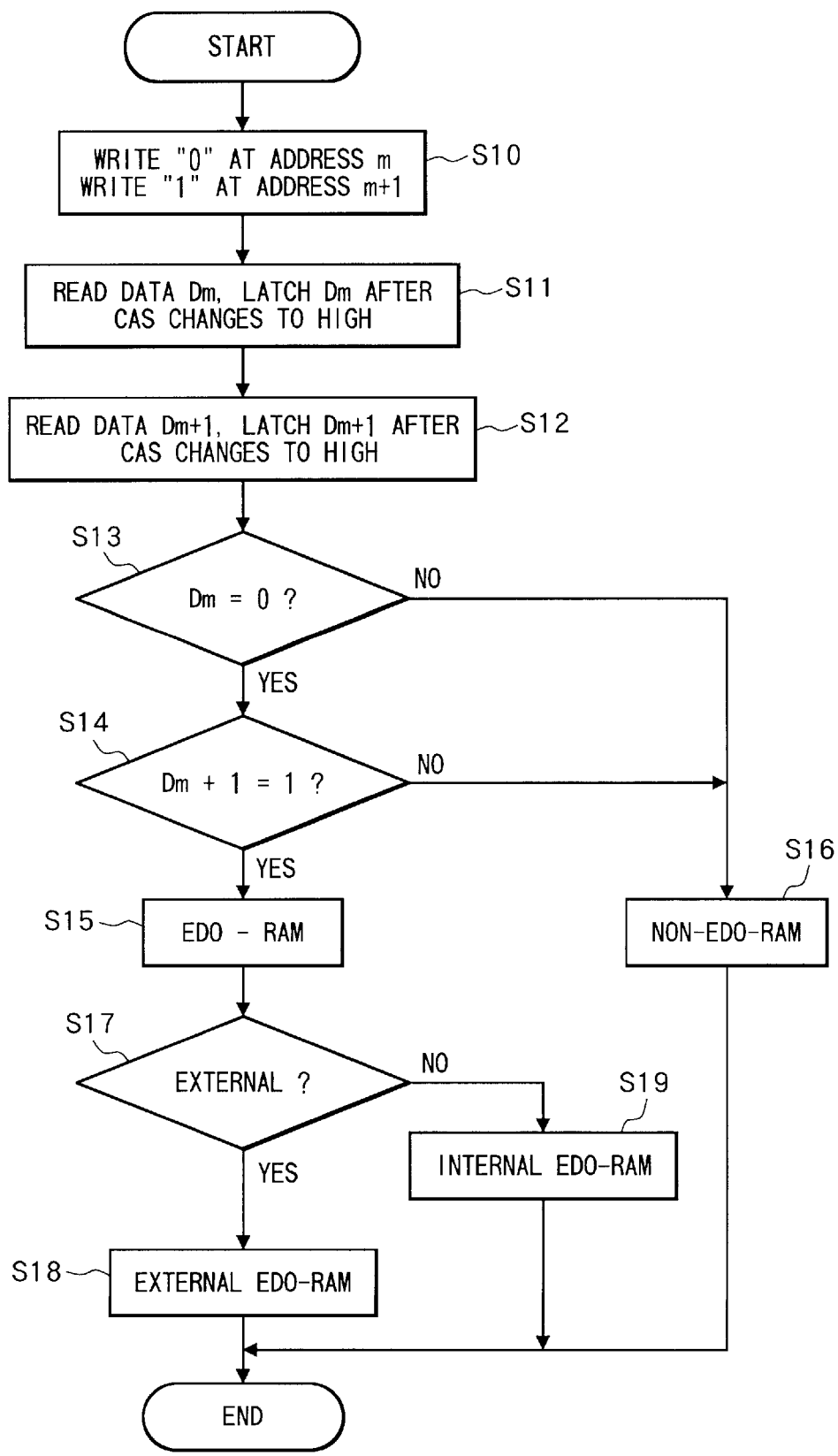
FIG. 8 is a flowchart showing the details of the EDO-DRAM determining step of FIG. 7.

During the determining process of S1, the CPU 1 executes the processes of FIG. 8 for determining the type of the subject DRAM.

As described already, the input/output terminal I/O of each DRAM mounted in the printer 100 is connected to the pull-up resistor. Output data will become high level when the predetermined time has elapsed after the output data becomes the high impedance state.

During the determination process, the CPU 1 first controls the DRAM control circuit 50 *a* to select, in a data write mode, address "m" indicative of a memory cell in the subject DRAM to be determined. More specifically, the CPU 1 outputs a write control signal and address data "m" to the DRAM control circuit 50a, whereupon the DRAM control circuit 50a selects the address "m". It is noted that as the address "m", any addresses located inside the subject DRAM can be used. In this example, a first address in the subject DRAM is used. The CPU 1 further outputs data of zero (0) via the address bus 38 so that data Dm of zero (0) is written to the address "m".

Next, the CPU 1 controls the DRAM control circuit 50a to select the next address "m+1" indicative of the next memory cell that is located also in the present DRAM to be determined. The CPU 1 then outputs data of one (1) via the address bus 38 so that data Dm+1 of one (1) is written to the address "m+1".

Next, in S11, the CPU 1 controls the DRAM control circuit 50a to read the data Dm from the address "m". That is, the CPU 1 outputs a read control signal and address data "m" to the DRAM control circuit 50a, whereupon the DRAM control circuit 50a selects the address "m" to output data Dm. The CPU 1 latches the read out data after controlling the DRAM control circuit 50a to switch the column address strobe signal CAS# to High.

In the same manner as in S11, the CPU 1 controls in S12 the DRAM control circuit 50a to read the data Dm+1 from the address "m+1". The CPU 1 latches the read out data after controlling the DRAM control circuit 50a to switch the column address strobe signal CAS# to High.

Then, the program proceeds to S13 where the CPU 1 checks the value of the latched data Dm. Then, in S14, the CPU 1 further checks the value of the latched data Dm+1.

It is noted that when the subject DRAM is EDO-DRAM, even when data is latched after the column address strobe signal CAS# becomes High level, the data does not become a high impedance state, and can therefore be read normally as shown in FIG. 5(b). Accordingly, the judgment result shows that each of data Dm and Dm+1 is exactly the same as has been written (yes in S13 and S14).

When the subject DRAM is non-EDO-DRAM, on the other hand, when data is latched after the column address strobe signal CAS# becomes High level, the data becomes a high impedance state. Accordingly, the data gradually rises to high level due to the pull-up resistance as shown in FIG. 5(a). Accordingly, data in non-EDO-DRAM becomes gradually high level. The judgment result therefore shows that at least one of data Dm and Dm+1 becomes different from the originally-written data (no in S13 and/or S14).

Accordingly, when both of the retrieved data Dm and Dm+1 are judged to be exactly the same as has been written (yes in S13 and S14), the CPU 1 determines in S15 that the subject memory is EDO-DRAM. When at least one of the retrieved data Dm and Dm+1 is not as has been written (no in either S13 or S14), the CPU 1 determines in S16 that the subject memory is non-EDO-DRAM.

When It is determined that the subject memory is EDO-DRAM in S15, the program further proceeds to S17 to further check whether or not the present EDO-DRAM is an internal RAM or an external SIMM memory. In S17, the CPU 1 searches the memory map of FIG. 4, which is prepared for this printer system and which is stored in the ROM 2. The CPU 1 determines the type of the present EDO-DRAM by comparing the address "m" to this memory map. More specifically, the CPU 1 determines the present EDO-DRAM to be internal memory in S19 if the address "m" is located between addresses "40000000" and "40FFFFFF". The CPU 1 determines the present EDO-DRAM to be external memory in S18 if the address "m" is outside this address range.

It is preferable that the CPU 1 be programmed to perform the above-described checking operation of S1 onto all of a plurality of banks that are provided in each DRAM. That is, the CPU 1 repeatedly performs the checking operation of S1 onto all the banks in the DRAM, subjected to the process of S1, through successively changing the address value "m" to the first addresses "0000" of the respective banks. When the program proceeds to S15 for some address value "m", the CPU 1 judges in S17 whether or not the subject address value "m" is within the internal memory area "40000000" through "40FFFFFF." According to the judged results, the CPU 1 determines that the corresponding bank is located within external EDO-DRAM or internal EDO-DRAM. Through successively checking all the DRAM banks arranged in the memory map of FIG. 4, the CPU 1 determines the type of each DRAM that is constructed from the plurality of banks.

Thus, the determination process of S1 is completed. During the judgment process of S2, if the subject RAM has been determined as non-EDO-DRAM in S16, the corresponding flag register (EDOFLAG) is set to zero (0). If the subject RAM has been determined as internal EDO-DRAM in S19, the corresponding flag register (EDOFLAG) is set to one (1). If the subject RAM has been determined as external EDO-DRAM in S18, the corresponding flag register (EDOFLAG) is also set to one (1).

In the above description, the determination process of S1 is executed for both the internal RAM area 3 and the external RAM area 4. However, because the type of the internal RAM 3 is already known, it may be possible to simply set in S3 the first flag register (EDOFLAG0) 20 for the internal RAM 3 to the value of one (1) corresponding to the type of the internal RAM 3. The determination process of S1 may be executed only for the areas set as the external RAMs 4a and 4b in the memory map.

As described above, after the system 100 is turned on, the setting process of FIGS. 7 and 8 are executed by the CPU 1 to perform setting operations onto the EDOFLAG registers 20–22. In the present example, the register (EDOFLAG0) 20 for the internal RAM 3 is set to one (1), the register (EDOFLAG1) 21 for the expanded RAM 4a is set to zero (0), and the register (EDOPLAG 2) 22 for the expanded RAM 4b is set to one (1).

After this setting processes, the system 100 performs memory control process onto the DRAMs 3, 4a, and 4b according to the types of the DRAMs in a manner described below.

When the CPU 1 outputs a writing control signal and outputs one or more successive sets of address data indicative of addresse(s) located within the area "$4000-0000"–"$40FF-FFFF", the DRAM control circuit 50a refers to the corresponding flag register 20. Because the flag register 20 is set with one (1), the DRAM control circuit 50a determines to execute EDO page mode. Because the address is located within internal RAM area, the DRAM control circuit 50a determines that a relevant DRAM to be accessed is not external EDO-DRAM. Accordingly, the DRAM control circuit 50a performs a DRAM write cycle as shown in FIG. 6(a) while controlling the signals RAS#, CAS#, and row and column address data in the EDO page mode as shown in FIG. 5(b).

When the CPU 1 outputs a reading control signal and outputs one or more successive sets of address data indicative of address(es) located within the area "$4000-0000"–"$40FF-FFFF", the DRAM control circuit 50a refers to the corresponding flag register 20. In the same manner as described above, the DRAM control circuit 50a determines to execute EDO page mode, and determines that a relevant DRAM to be accessed is not external EDO-DRAM. Accordingly, the DRAM control circuit 50a performs a DRAM read cycle as shown in FIG. 6(a) while controlling the signals RAS#, CAS#, and row and column address data in the EDO page mode as shown in FIG. 5(b). The DRAM control circuit 50a switches the output enable signal OE# to High after the read cycle, thereby disabling data output from the DRAM 3.

When the CPU 1 outputs a writing control signal and outputs one or more successive sets of address data indicative of address(es) located within the area "$4100-0000"–"$41FF-FFFF", the DRAM control circuit 50a refers to the corresponding flag register 21. Because the flag register 21 is set with zero (0), the DRAM control circuit 50a determines to execute fast page mode. The DRAM control circuit 50a therefore determines that a relevant DRAM to be accessed is not external EDO-DRAM. Accordingly, the DRAM control circuit 50a performs a DRAM write cycle as shown in FIG. 6(a) while controlling the signals RAS#, CAS#, and row and column address data in the fast page mode as shown in FIG. 5(a).

When the CPU 1 outputs a reading control signal and outputs one or more successive sets of address data indicative of address(es) located within the area "$4100-0000"–"$41FF-FFFF", the DRAM control circuit 50a refers to the corresponding flag register 21. In the same manner as described above, the DRAM control circuit 50a determines to execute fast page mode, and determines that a relevant DRAM to be accessed is not external EDO-DRAM. Accordingly, the DRAM control circuit 50a performs a DRAM read cycle as shown in FIG. 6(a) while controlling the signals RAS#, CAS#, and row and column address data in the fast page mode as shown in FIG. 5(a). The DRAM control circuit 50a switches the column strobe signal CAS# to High after the read cycle, thereby disabling data output from the DRAM 4a.

When the CPU 1 outputs a writing control signal and outputs one or more successive sets of address data indicative of address(es) located within the area "$4200-0000"“$42FF-FFFF", the DRAM control circuit 50a refers to the corresponding flag register 22. Because the flag register 22 is set with one (1), the DRAM control circuit 50a determines to execute EDO page mode. Because the address is located within external RAM area, the DRAM control circuit 50a determines that a relevant DRAM to be accessed is external EDO-DRAM. Accordingly, the DRAM control circuit 50a performs a DRAM write cycle as shown in FIG. 6(b) while controlling the signals RAS#, CAS#, and row and column address data in the EDO page mode as shown in FIG. 5(b).

When the CPU 1 outputs a reading control signal and outputs one or more successive sets of address data indicative of address(es) located within the area "$4200-0000"“$42FF-FFFF", the DRAM control circuit 50a refers to the corresponding flag register 22. In the same manner as described above, the DRAM control circuit 50a determines to execute EDO page mode, and determines that a relevant DRAM to be accessed is external EDO-DRAM. Accordingly, the DRAM control circuit 50a performs a DRAM read cycle as shown in FIG. 6(b) while controlling the signals RAS#, CAS#, and row and column address data in the EDO page mode as shown in FIG. 5(B). The DRAM control circuit 50a switches the row address strobe signal RAS#2 to High after the DRAM read cycle, thereby disabling data output from the DRAM 4b.

As described above, according to the present embodiment, when executing a read cycle onto external EDO-DRAM during EDO page mode, the row address strobe signal (RAS) is switched to High at the end of each read cycle. It therefore becomes possible to prevent data output conflicts between EDO-DRAM output data and ROM output data when a ROM read cycle is executed between DRAM read cycles. Accordingly, even when a SIMM configured with EDO-DRAM is used as a data storage device, it is possible to perform EDO mode reading operation for the SIMM, thereby enhancing operation speeds. It is therefore possible to execute high-speed read operations onto EDO-DRAM while reliably preventing data conflicts with other storage devices.

While the invention has been described in detail with reference to the specific embodiment thereof, it would be apparent to those skilled in the art that various changes and modifications may be made therein without departing from the spirit of the invention.

For example, in the above-described embodiment, the non-EDO-RAM 4a is constructed from the fast page mode provided DRAMs. However, the non-EDO-RAM 4a may be constructed from normal mode DRAMs. In this case, the DRAM control circuit 50a controls the extended RAM 4a in a normal mode as shown in FIG. 9 during each read cycle of FIG. 6(a) in a manner as described below.

When the CPU 1 outputs address data corresponding to one memory cell in the RAM 4a, the DRAM control circuit 50a decodes this address data, and separates the address data into a row address data and a column address data. The DRAM control circuit 50a first outputs the row address data, and then switches the row address strobe signal RAS# from high level to low level. Next, the DRAM control circuit 50a outputs the column address, and then switches the column address strobe signal CAS# from high level to low level. Then, the content of the selected memory cell is outputted as valid data and is read by the CPU 1.

Next, the CPU 1 outputs address data for another memory cell to be read next. The DRAM control circuit 50a decodes the address data into row address data and column address data. Then, in the same manner as described above, the memory cell is selected. That is, the DRAM control circuit 50a first supplies the row address data, and then switches the row address strobe signal RAS# from high level to low level. Next, the DRAM control circuit 50a outputs the column address data, and then switches the column address strobe signal CAS# from high level to low level. Then, the content of the selected memory cell is read to the CPU 1. As the DRAM control circuit 50a receives successive sets of address data, the DRAM control circuit 50a repeatedly performs the above-described operation.

During the write cycle of FIG. 6(a), the DRAM control circuit 50a controls the extended RAM 4a as shown in FIG. 9 in the normal mode in the same manner and at the same timings as described above. In the write mode, however, data outputted from the CPU 1 is written to the selected memory cell via the data bus 38.

In the above-described embodiment, the DRAM is designed to have a capacity of 4M words, wherein one (1) word equals four (4) bits. However, the present invention is not limited to this type of DRAM. The present invention can be applied to other various types of DRAM such as for one (1) word to equal one (1) bit, eight (8) bits, sixteen (16) bits, and the like. Further, various other capacities of DRAM can be used.

The present invention is not limited to the DRAMs provided with EDO page mode, but can be applied to DRAMs provided with burst EDO page mode.

In the embodiment described above, the present invention is applied to a printer system. However, the present invention can also be applied to other types of data processing systems that uses data storage devices while performing mode register settings as described above. Representative examples of such systems include: personal computers, word processors, photocopiers, communication devices, and the like.

In the above-described embodiment, the EDO-DRAMs are executed in the EDO page mode, and the fast page mode DRAM is executed in the fast page mode. However, the EDO-DRAMs may be executed in the fast page mode and the normal mode. The fast mode DRAM may be executed in the normal mode. The DRAM control circuit 50*a* may select which of the operation modes: EDO page mode, fast page mode, and the normal mode should be executed for the inputted address data.

As described above, according to the above-described embodiment and modifications, the data storage device such as the EDO-DRAM is provided with a plurality of memory elements which are arranged in a matrix form. The data storage device is designed so that a desired memory element can be selected through input of a set of row address data and a set of column address data indicative of the desired memory element and a row address strobe signal and a column address strobe signal, and so that process data can be read from and written into the selected memory element. The data storage device is designed so that a plurality of memory elements on the same single row can be selected through input of the row address strobe signal and a set of row address data indicative of the subject row and successive inputs of a plurality of sets of column address data while the column address strobe signal is repeatedly switched. The desired plurality of memory elements can be selected continuously even during selection time periods where the column address strobe signal is selected to be switched.

During the continuous mode, in order to select a plurality of desired memory elements located on a single row address, the row address strobe signal is switched from the non-selected state to the selected state, and then the row address strobe signal is maintained in the selected state continuously for a period of time, during which a plurality of different column strobe signals are serially selected so that corresponding memory elements are serially and continuously selected. At this time, even during time periods where the column address strobe signal is selected from the non-selected state to the selected state, process data can be continuously read from or written to the memory elements corresponding to the column address data.

Especially during the read mode, the row address strobe signal is further switched to the non-selected state at a predetermined timing when reading of process data from the selected memory elements is completed. It is now assumed that reading operation be executed onto the relevant data storage device through first and second read cycles and that reading operation will be executed onto another type of data storage device, such as a ROM, at a read cycle between the first and second read cycles. At the end of the first read cycle, the row address strobe signal is brought into the non-selected state. Accordingly, the data storage device such as the EDO-DRAM that is originally designed to continuously output data even during the selection period for the column address signal, is assuredly controlled to stop outputting data. No conflicts will occur between the process data from the relevant data storage device and process data from the other data storage device. Accordingly, fast reading/writing operation can be achieved while preventing occurrence of any error operations.

The normal mode can be selected for the data storage device such as the normal mode DRAM. During the normal mode, in order to select some desired memory element in the data storage device, the row address data is inputted to the storage device when the row address strobe signal is switched from a non-selected state to a selected state. Then, the column address data is inputted to the storage device when the column address strobe signal is switched from a non-selected state to a selected state. Thus, the desired memory element is selected based on the inputted row address data and column address data. Then, process data stored at the selected memory element is read, or process data is written to the selected memory element.

What is claimed is:

1. A control system comprising:

a data storage device provided with a plurality of memory elements arranged in a matrix form, each memory element being defined by a corresponding column address and a corresponding row address, the data storage device being able to output process data from each memory element, accessed by corresponding row address data and a row address strobe signal in a selected state and corresponding column address data and a column address strobe signal in a selected state, the data storage device being able to output process data from the accessed memory element even after a column address strobe signal switches to a non-selected state;

means for selecting either one of a write mode for writing process data to a desired memory element and a read mode for reading process data from a desired memory element;

means for determining to execute a continuous mode for switching only column address data while fixing row address data when desiring to select at least one memory element located in a single row address; and means for, when the continuous mode is determined to be executed, serially accessing at least one desired memory element defined by a single row address and at least one column address through outputting one set of row address data indicative of the row address and continuously outputting a row address strobe signal of the selected state to continuously select the single row address while successively outputting at least one set of column address data indicative of the at least one column address and successively outputting a column address strobe signal of a selected state, the memory element accessing means switching, during the read mode, the row address strobe signal to a non-selected state at a timing when reading is completed from the desired at least one memory element.

2. A control system as claimed in claim 1, wherein the data storage device includes an extended data out mode-provided dynamic random access memory which can output process data for the accessed at least one memory element even while the column address strobe signal is in the non-selection state, and wherein the determining means determines an extended data output (EDO) page mode as the continuous mode.

3. A control device as claimed in claim 2, wherein the data storage device includes a single inline memory module provided with the plurality of extended data out mode-provided dynamic random access memories, an output enable terminal of each extended data out mode-provided dynamic random access memory being fixed to an enabled state.

4. A control system as claimed in claim 3, further comprising another data storage device including another type of extended data out mode-provided dynamic random access memory whose output enable terminal being controllable between the enabled state and a disabled state, and wherein the memory element accessing means includes:
means for judging whether the desired at least one memory element is located in the single inline memory module or the other type of extended data out mode-provided dynamic random access memory; and
means for, when the desired at least one memory element is located in the other type of extended data out mode-provided dynamic random access memory, switching an output enable signal to the enabled state during the read mode while serially accessing the at least one desired memory element, and switching the output enable signal to the disabled state at the timing when reading is completed from the desired at least one memory element, the means failing to control the output enable signal when the desired at least one memory element is located in the single inline memory module during the read mode.

5. A control system as claimed in claim 3, further comprising:
another first data storage device including a fast page mode-provided dynamic random access memory, which is provided with a plurality of memory elements arranged in a matrix form, each memory element being defined by a corresponding column address and a corresponding row address, the other first data storage device being able to output process data from each memory element, accessed by corresponding row address data and a row address strobe signal in the selected state and corresponding column address data and a column address strobe signal in the selected state, until the column address strobe signal switches to the non-selected state; and
means for judging whether or not the desired at least one memory element is located in the data storage device or the other first data storage device,
wherein the memory element accessing means switches the row address strobe signal to the non-selected state at the reading complete timing during the read mode for the data storage device.

6. A control system as claimed in claim 3, further comprising:
another second data storage device including a normal mode-provided dynamic random access memory; and
means for judging whether or not the desired at least one memory element is located in the data storage device or the other second data storage device,
wherein the determining means includes means for selecting the extended data output (EDO) page mode for the data storage device and the normal mode for the other second data storage device, the normal mode being for selecting each desired memory element through switching both the row address strobe signal and the column address strobe signal, and
wherein the memory element accessing means includes:

means, executed when the extended data output (EDO) page mode is selected for the extended out mode-provided dynamic random access memory, for serially accessing the at least one desired memory element defined by the single row address through outputting one set of row address data indicative of the row address and continuously outputting the row address strobe signal of the selected state while successively outputting the at least one set of column address data and successively outputting the column address strobe signal of the selected state, and for switching the row address strobe signal to the non-selected state at the reading complete timing during the reading mode; and
means, executed when the normal mode is selected for the normal mode-provided dynamic random access memory, for accessing each desired memory element defined by one row address and one column address through outputting one set of row address data indicative of the row address and a row address strobe signal of a selected state and outputting one set of column address data and a column address strobe signal of a selected state.

7. A control device for controlling a data storage device provided with a plurality of memory elements which are arranged in a matrix form, the data storage device being designed so that a desired memory element can be selected through input of a set of row address data and a set of column address data indicative of the desired memory element and a row address strobe signal and a column address strobe signal, and so that process data can be read from and written into the selected memory element, the data storage device being designed so that a plurality of memory elements on the same single row can be selected through input of the row address strobe signal and a set of row address data indicative of the subject row and successive inputs of a plurality of sets of column address data while the column address strobe signal is repeatedly switched, the desired plurality of memory elements being selected continuously even during selection time periods where the column address strobe signal is selected to be switched, the control device comprising:
means for selecting either one of a write mode for writing process data to a desired memory element and a read mode for reading process data from the desired memory element;
means for determining, as a memory element selection mode, a continuous mode for selecting a desired memory element through switching only the column address data while fixing the row address data;
means for selecting at least one desired memory element on a single row through outputting, into the data storage device, a set of row address data indicative of the subject row and a row address strobe signal of a fixed state so as to be capable of continuously selecting the subject row address, while switchingly outputting at least one set of column address data so as to be capable of serially selecting at least one column address, the memory element selecting means, when the read mode is selected during the continuous mode, switching the row address strobe signal to a non-selected state at a timing when reading is completed from the selected memory element; and
means for reading process data from the selected at least one memory element when the read mode is selected and for writing process data into the selected at least one memory element when the write mode is selected.

8. A control device as claimed in claim 7, wherein the data storage device is an extended data out mode-provided dynamic random access memory (EDO-DRAM).

9. A control device as claimed in claim 8, wherein the data storage device includes a single inline memory module (SIMM) where the plurality of extended data out mode-provided dynamic random access memories (EDO-DRAMs) are provided, with an output enable selection signal for selecting an output state of each EDO-DRAM being fixed to the selected state.

10. A control device as claimed in claim 8, further comprising:

another data storage device of a type other than the extended data out mode-provided dynamic random access memory; and means for judging whether or not a DRAM to be selected is the extended data out mode-provided dynamic random access memory (EDO-DRAM) or the other storage device, wherein the memory element selecting means, when the selected DRAM is judged as the extended data out mode-provided dynamic random access memory (EDO-DRAM), switches the row address strobe signal to the non-selected state at the timing when reading operation of process data from the selected memory element is completed during the read mode even when the continuous mode is selected.

11. A control device as claimed in claim 7, wherein the determining means includes means for selecting a memory element selection mode from the continuous mode and a normal mode for selecting each desired memory element through switching both the row address data and the column address data, wherein the memory element selection means selects, when the normal mode is selected, a desired memory element through outputting, into the data storage device, a set of row address data and a set of column address data indicative of the desired memory element and a row address strobe signal and a column address strobe signal.

12. A method for controlling a data storage device provided with a plurality of memory elements which are arranged in a matrix form, the data storage device being designed so that a desired memory element can be selected through input of a set of row address data and a set of column address data indicative of the desired memory element and a row address strobe signal and a column address strobe signal, and so that process data can be read from and written into the selected memory elements, the data storage device being designed so that a plurality of memory elements on the same single row can be selected through input of the row address strobe signal and a set of row address data indicative of the subject row and then successive inputs of a plurality of sets of column address data while the column address strobe signal is repeatedly switched, the desired plurality of memory elements being selected continuously even during selection time periods where the column address strobe signal is selected to be switched, the control method comprising the steps of:

selecting either one of a write mode for writing process data to a desired memory element and a read mode for reading process data from the desired memory element;

determining, as a memory element selection mode, a continuous mode for selecting a desired memory element through switching only the column address data while fixing the row address data;

selecting at least one desired memory element on a single row through outputting, into the data storage device, a set of row address data indicative of the subject row and a row address strobe signal of a fixed state so as to be capable of continuously selecting the subject row address, while switchingly outputting at least one set of column address data so as to be capable of serially selecting at least one column address, the memory element selecting step, when the read mode is selected during the continuous mode, switching the row address strobe signal to a non-selected state at a timing when reading is completed from the selected memory element; and reading process data from the selected at least one memory element when the read mode is selected and writing process data into the selected at least one memory element when the write mode is selected.

13. A control method as claimed in claim 12, wherein the data storage device is an extended data out mode-provided dynamic random access memory (EDO-DRAM).

14. A control method as claimed in claim 13, wherein the data storage device includes a single inline memory module (SIMM) where the plurality of extended data out mode-provided dynamic random access memories (EDO-DRAMs) are provided, with an output enable selection signal for selecting an output state of each EDO-DRAM being fixed to the selected state.

15. A control method as claimed in claim 13, further comprising the steps of:

judging whether or not a DRAM to be selected is the extended data out mode-provided dynamic random access memory (EDO-DRAM) or another storage device of a type other than the extended data out mode-provided dynamic random access memory, wherein the memory element selecting step, when the selected DRAM is judged as the extended data out mode-provided dynamic random access memory (EDO-DRAM), switches the row address strobe signal to the non-selected state at the timing when reading operation of process data from the selected memory element is completed during the read mode even when the continuous mode is selected.

16. A control method as claimed in claim 12, wherein the determining step includes the step of selecting a memory element selection mode from the continuous mode and a normal mode for selecting each desired memory element through switching both the row address data and the column address data, wherein the memory element selection means selects, when the normal mode is selected, a desired memory element through outputting, into the data storage device, a set of row address data and a set of column address data indicative of the desired memory element and a row address strobe signal and a column address strobe signal.

* * * * *